United States Patent [19]

Ideler

[11] Patent Number: 5,515,002
[45] Date of Patent: May 7, 1996

[54] POWER AMPLIFIER FOR FEEDING AN INDUCTIVE LOAD HAVING SWITCHED TRANSISTORS

[75] Inventor: Karl-Heinz Ideler, Spardorf, Germany

[73] Assignee: Siemens Aktiengesellschaft, Munich, Germany

[21] Appl. No.: 371,823

[22] Filed: Jan. 12, 1995

[30] Foreign Application Priority Data

Jan. 20, 1994 [DE] Germany .................. 44 01 609.3

[51] Int. Cl.[6] .................................................. H03F 3/217
[52] U.S. Cl. .................................... 330/251; 330/146
[58] Field of Search ........................... 330/146, 207 A, 330/251; 363/98, 132

[56] References Cited

U.S. PATENT DOCUMENTS 4,201,957  5/1980  Cathell ........................... 363/132 X
5,113,145  5/1992  Ideler et al. ...................... 330/251

*Primary Examiner*—Steven Mottola
*Attorney, Agent, or Firm*—Hill, Steadman & Simpson

[57] ABSTRACT

Power amplifier for the feed of an inductive load having switched transistors is composed of a bridge circuit, wherein a plurality of series circuits of transistors with free running diodes are connected parallel in each bridge arm. An inductor is arranged in the connection of each series circuit to the inductive load, this inductor being current-compensated such that it has an effective inductance only when a non-uniform division of current occurs in a bridge arm. The transistors and diodes are linearly arranged.

14 Claims, 3 Drawing Sheets

POWER AMPLIFIER FOR FEEDING AN INDUCTIVE LOAD HAVING SWITCHED TRANSISTORS

BACKGROUND OF THE INVENTION

1. Field of the Invention

The invention is directed to a power amplifier of the type suitable for feeding an inductive load having switched transistors.

2. Description of the Prior Art

U.S. Pat. No. 5,113,145 discloses such a power amplifier wherein one bridge half is provided for each direction of current through the inductive load. A first bridge arm having a parallel group of series circuits of transistors with free running diodes and a second bridge arm having a parallel group of series circuits of free running diodes with transistors are respectively arranged between supply voltage terminals. The inductive load is connected between the junction points of transistors and free running diodes of the first bridge arm and the junction points of transistors and free running diodes of the second bridge arm.

Power MOSFETs are thereby employed, which enable higher switching speeds and, thus, reduced switching losses compared to bipolar transistors. By contrast to bipolar transistors, moreover, MOSFETs do not have a turn-off delay retarded by storing time, so that the regulatability of the power amplifier is improved. One disadvantage of power MOSFETs compared to bipolar transistors is the low current-carrying capability of MOSFETs. Many MOSFETs must be connected parallel when high currents are required of a power amplifier.

High demands are made on power amplifiers, for example, in the case of gradient amplifiers of nuclear magnetic resonance tomography systems. Coil arrangements for generating linear magnetic field gradients must be supplied with current via such power amplifiers. For example, the following, typical demands are made on such power amplifiers:

a) The currents must be capable of being exactly set within a broad range;
b) Currents in two directions are required;
c) The curve shape of a current prescribed by a drive must be reproduced as precisely as possible;
d) The power amplifier must deliver an output voltage that assures an adequate rise rate of the current of the gradient coil;
e) The power amplifier must allow an optimally high "duty cycle" given an optimally high nominal current; and
f) The power amplifier must be as compact as possible.

With the parallel connection of many transistors and a desire to have a high switching speed, the problem of uniform distribution of current among the parallel transistors arises. Particularly when switching events occur, there is the risk that the distribution of the current will be non-uniform, for example, due to line inductances, potentially leading to the destruction of transistors.

According to the initially cited U.S. Pat. No. 5,113,145, this problem is resolved by securing the parallel transistors on a thermally and electrically conductive, first ring, with the transistors uniformly distributed around this ring and respectively electrically connected thereto with one terminal. The connections to further terminals of the transistors ensues substantially rotational-symmetrically via large-area printed circuit boards.

Due to the symmetrical arrangement of the transistors in circular form and due to a planar execution of the connecting lines, uniform distribution of the current to be switched among the individual transistors is assured at any point at time, even given the highest switching speeds that can be achieved. An inductor is provided in each bridge arm in order to prevent formation of the parasite diode, which is inherent in every MOSFET transistor and which exhibits a relatively long reverse recovery time, from causing an inadmissibly high quadrature-axis component of the current. The load current can thus only commute to an inherent diode via these inductors. In order to keep the structural volume of the inductors within limits, a saturation of the inductor cores by the output current is avoided by means of a current compensation of the inductors.

An extremely compact structure is achieved in this known arrangement. Due to the rotational-symmetrical arrangement, however, specific cooling members that are relatively complicated in terms of manufacture and printed circuit boards are required. This known power amplifier is designed for currents up to 250 A and output voltages up to ±300 V. Given employment of fast pulse sequences in nuclear magnetic resonance tomography, however, these values are not adequate. Given higher dissipative energies of the semiconductor components, the dissipated heat can not be economically eliminated by means of air cooling. At higher operating voltages, the known structure is also problematical because in the possibility of creep paths arising.

SUMMARY OF THE INVENTION

It is therefore an object of the invention to provide a power amplifier of the type initially cited which can accommodate higher operating voltages, can eliminate a higher dissipated power and which forgoes a need for specific components that are complicated to manufacture.

This object is achieved in accordance with the principles of the present invention in a power amplifier for feeding an inductive load wherein the groups of transistor switches and free running diodes are linearly arranged and wherein an inductor is arranged in the connection of every series circuit to the inductive load, this inductor being current-compensated such that it only exhibits an effective inductance when a non-uniform distribution of current between the series circuits arises in a bridge arm.

Higher operating voltages and higher dissipated powers can be managed better due to the use of the linear arrangement. The circuit can be modularly constructed, i.e. the power amplifier can be composed of an arbitrary number of individual amplifiers that can be connected in parallel regardless of their geometrical arrangement. Due to the linear structure, specific mechanical parts for the cooling member that are difficult to manufacture and a complicated printed circuit board design can be foregone. The substantially uniform loading of all transistors that is assured in the above-recited prior art by the rotational-symmetrical arrangement is achieved by the current-compensated inductors in the invention.

DESCRIPTION OF THE PREFERRED EMBODIMENTS

Figure 1:
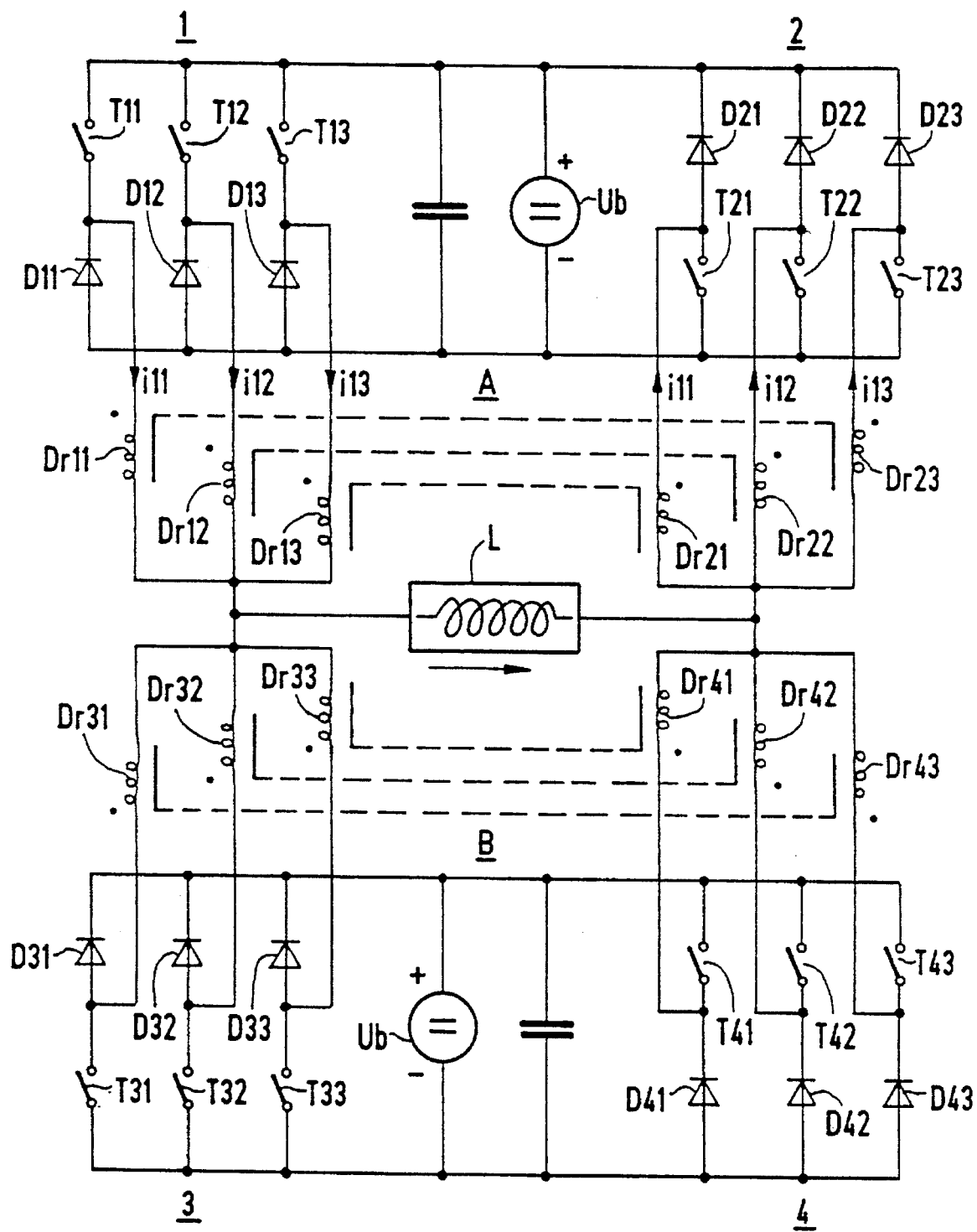
FIG. 1 a schematic circuit diagram of the power amplifier constructed in accordance with the principles of the present invention.

FIG. 1 shows a schematic circuit of the power amplifier of the invention having two bridge halves A and B. Each bridge half A and B delivers the current through the inductive load L for one direction of current. A pair of bridge arms 1 and 2, and a pair of bridge arms 3 and 4, having groups of series circuits, are respectively provided in the bridge halves A and B between two supply voltage terminals Ub+ and Ub−. In the bridge arm 1 of bridge half A, three series circuits of transistor switches T11 through T13. Three series circuits of transistor switches T41 through T43 with diodes D41 through D43 are provided in bridge arm 4 of bridge half B with diodes D11 through D13 are provided. The first numeral thereby indicates the affiliation to the corresponding bridge arm and the second numeral is sequential for parallel components of each bridge arm. This nomenclature shall also be retained below.

The transistor switches T11 through T13 and T41 through T43 each lie at the positive terminal of the operating voltage source Ub. The anodes of the diodes D11 through D13 and D41 through 43 lie at the negative terminal of the operating voltage source Ub. The second bridge arm 2 bridge half A is likewise composed of a plurality of series transistor switches T21 through T23 and diodes D21 through D23 and bridge arm 3 in bridge half B contains transistor switches T31 through T33 and diodes D31 through D33. In these second bridge arms 2 and 3, however, the respective transistors are connected to the negative terminal of the supply voltage source Ub and the cathodes of the respective diodes are connected to the positive terminal of the supply voltage source Ub.

The junction points of the diodes D11 through D13 with the transistor switches T11 through T13 are respectively connected via inductors Dr11 through Dr13 to a first terminal of the inductive load L. The junction points of the diodes D21 through D23 with the transistor switches T21 through T23 are connected via respective inductors Dr21 through Dr23 to the second terminal of the inductive load L. Likewise, the junction points of the transistor switches T31 through T33 with the diodes D31 through D33 are connected via respective inductors Dr31 through Dr33 to the first terminal of the inductive load L and the junction points of the diodes D41 through D43 with the transistor switches T41 through T43 are connected via respective inductors Dr41 through Dr43 to the second terminal of the inductive load.

The inductors Dr11 and Dr23, Dr12 and Dr22, Dr13 and Dr21, Dr31 and Dr43, Dr32 and Dr42 and Dr33 and Dr41 are respectively magnetically coupled to one another, i.e., the corresponding windings lie on a common core. These magnetic couplings are shown in FIG. 1 with dashed lines. The winding sense (direction) of all inductors of bridge half A is the same and the winding sense of all inductors of bridge half B is the same, this being indicated in FIG. 1 by dots at the inductors Dr1 through Dr4.

For feeding the inductive load L in the direction of current marked by an arrow in FIG. 1, the transistor switches T11 through T13 and T21 through T23 are simultaneously switched on (closed). The current through the inductive load L is defined by a pulse width modulation of the drive of the transistor switches T11 through T13 and T21 through T23. When the transistor switches T11 through T13 and T21 through T23 are switched off (open), the current continues to be driven through the inductive load L and flows via the free running diodes D11 through D13 and D21 through D23. The analogous case applies to the second bridge half B except that, differing from bridge half A, bridge half B generates a current in negative direction through the inductive load L.

As long as the load current is uniformly distributed among the parallel transistor switches and associated diodes T11 through T13 and D11 through D13; T21 through T23 and D21 through D23; T31 through T33 and D31 through D33; T41 through T43 and D41 through D43, two respective currents in opposite direction flow through the coupled inductors Dr11 and Dr23, Dr12 and Dr22, Dr13 and Dr21, so that no resultant magnetic flux, and thus no resultant inductance, arises. This is also referred to as "current-compensated" inductor. Given a uniform division of current, no disturbing inductance thus lies in the path of the current to the inductive load. When, however, one transistor switches somewhat faster than the others, a magnetic flux arises due to the difference in current, and thus an inductance arises that decelerates the current rise in the path switching faster until the same current flows therein as in the current path coupled via the corresponding inductor.

Figure 2:
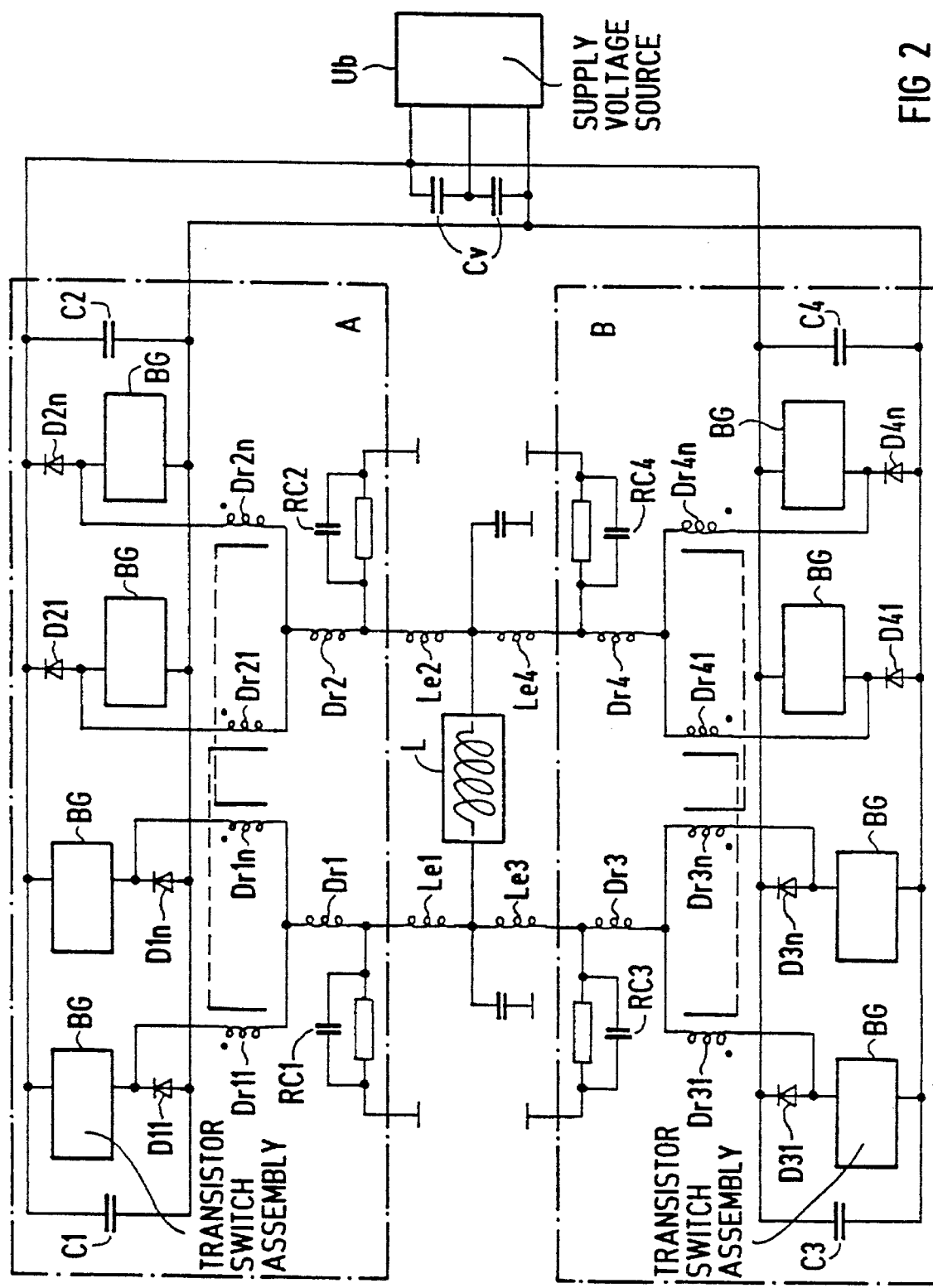
FIG. 2 is a detailed circuit diagram of the exemplary embodiment of FIG. 1.
Figure 3:
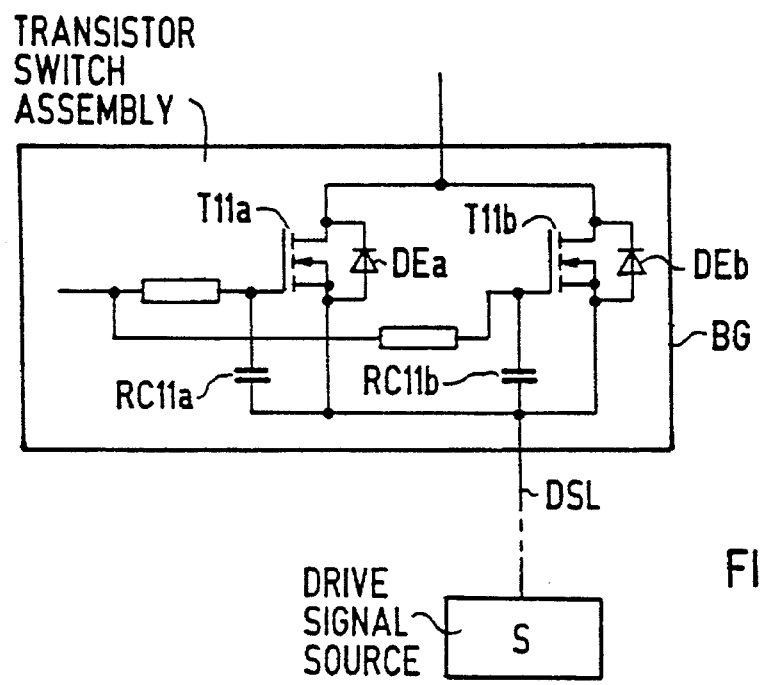
FIG. 3 is a detailed circuit diagram of an assembly shown in FIG. 2.

A more detailed circuit diagram of the power amplifier is shown in FIGS. 2 and 3. FIG. 3 shows a detailed circuit of one of the identically constructed assemblies BG (forming transistor switches) of FIG. 2, whereby the number (11) of the components (T11a, T11b, RC11a, RC11b) refers here to the first assembly BG in the first bridge arm. A total of n series circuits of transistors and diodes are connected to the assemblies parallel in every bridge arm, whereby only the first and the last series circuit are respectively shown.

In the illustrated exemplary embodiment for the first assembly BG, two transistors T11a and T11b are each connected parallel with a diode such as diodes DEa and DEb and the transistors T11a and T11b are connected in series. The transistors in the respective bridge halves are driven by a drive signal source S, connected to the transistors via a plurality of drive signal lines, one of which is shown in FIG. 3 referenced DSL. The transistors T11a and T11b are respectively driven via RC elements RC11a and RC11b. These RC elements are dimensioned such that their time constant is significantly greater than the differences in the transit times of the drive signals to the individual transistors. These transit time differences arise due to the unavoidable fact that the respective drive signal lines DSL will have different lengths running between the drive signal source S and the drive transistors. This prevents individual transistors from being driven faster than others due to such differences in transit time.

Each bridge half A and B is fed by a common supply voltage source $U_B$, with buffer capacitors $C_v$ connected to the supply voltage source $U_B$. Further, every group of series circuits of respective diodes D31 . . . D3n and an assembly BG has a buffer capacitor C1–C4 connected parallel to it. Finally, a filter follows each output of the bridge arms, this filter being respectively composed of one of inductors Dr1 through Dr4 in series with the output and connected in parallel with one of RC elements RC1 through RC4, connected to ground. These filters are intended to prevent high-frequency disturbances from being transmitted on the leads to the inductive load L. The external line inductances Le1 through Le4 in the leads to the inductive load L are also shown in FIG. 2.

The inductors Dr1 through Dr4 act not only to make the current distribution between the individual series circuits more uniform but also simultaneously act as current-limiting inductances between the bridge arms 1 and 3 as well as 2 and 4. It is thus possible to switch the transistors of two bridge arms lying in series without time gaps, i.e., without a dead time, as a result of which distortions at the zero axis crossing are avoided.

The inductors Dr11 through Dr4n also act as filter inductances. They lie in series with the filter inductors Dr1 through Dr4 and thus increase the series inductance. The current compensation, which prevents the inductors Dr11 through Dr4y from representing an inductance for the nominal current given uniform division of current, does not degrade their filter inductance effect.

Figure 4:
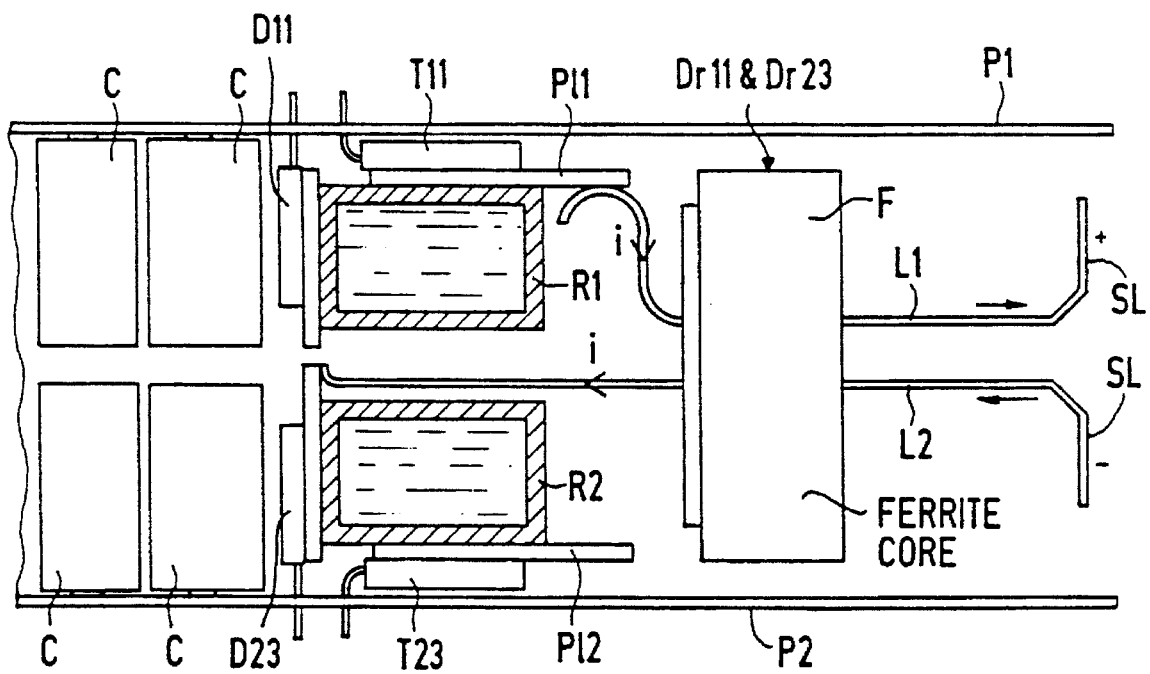
FIG. 4 shows mechanical structure of the power amplifier of the invention.

The mechanical structure of a bridge half is shown in FIG. 4 in a cross-sectional view. Two quadrangular tubes traversed by coolant are arranged parallel to one another in a column-shaped arrangement. All power semiconductor components for one bridge arm are secured to quadrangular tube R1 and all power semiconductor components for the other arm are secured to quadrangular tube R2. The transistor switch (of which T1 and T23 can be seen) are thereby respectively secured on one wider side of the quadrangular tube and the diodes (of which D11 and D23 can be seen) are secured to a narrower side of the respective quadrangular tube R1 or R2. In order to create short line paths between the transistors and free running diodes, elements allocated to one another are respectively connected in immediate proximity of one another and have their terminals directed toward one another. A highly thermally conductive lamina Pl1 or Pl2 is arranged between the respective power semiconductor components and the quadrangular tubes R1 and R2. The power semiconductor components such as T11 and D11 the first bridge arm such as T23 and D23 of the second bridge arm are spatially allocated to one another such that these pairs power semiconductor components which are respectively allocated to two magnetically coupled inductors such as Dr11 and Dr23 lie in respective planes oriented perpendicular to the longitudinal direction (into and out of the drawing plane) of the arrangement. The two magnetically coupled inductors can thus be composed to a single ferrite core F through which the two leads to the power semiconductor components of the first and second bridge arms allocated to one another are conducted the leads respectively carrying currents in opposite directions. The leads to all series circuits connected in parallel with one another are combined in two bus bars SL1 and SL2 proceeding parallel to the cooling members R1 and R2, the inductive load L being connected to these bus bars.

Respective printed circuit boards P1 and P2 are provided at the upperside and underside of the structural unit, the lead wires of the power semiconductor components among other things, being soldered thereto. The terminal to the supply voltage $U_B$, as the drive of the transistors, ensues via these printed circuit boards P1 and P2.

The capacitors C required for each bridge arm are also built into the structural unit.

For example, two assemblies shown in FIG. 4 are required for the complete bridge circuit, one for the positive and one for the negative current direction through the inductive load. Since the entire unit is modularly constructed, however, the power amplifiers could also be divided onto more than two assemblies.

Since soldering need only ensue at the underside and upperside of the assemblies given the unit shown in FIG. 4, the application of a flow solder method at the completely assembled assembly can be accomplished without difficulty.

High electric strengths can be achieved with the illustrated arrangement. For example, a power amplifier having an operating voltage of 800 V was constructed. Due to the modular structure, the plurality of sub-amplifiers connected in parallel with one another can be matched to conform to the requirements of the current. A uniform loading of all sub-amplifiers is achieved by the circuit disclosed herein, regardless of its geometrical arrangement.

Although modifications and changes may be suggested by those skilled in the art, it is the intention of the inventor to embody within the patent warranted hereon all changes and modifications as reasonably and properly come within the scope of his contribution to the art.

I claim as my invention:

1. A power amplifier for feeding an inductive load, comprising:

a first bridge half connected to terminals of a voltage supply;

a second bridge half connected to said terminals of said voltage supply;

said first and second bridge halves being connected to said load and said first and second bridge halves being connected with respectively opposite polarities to said terminals so that said first bridge half supplies said load with a first current in a first direction and said second bridge half supplies said load with a second current in a second direction opposite to said first direction;

said first bridge half having first and second bridge arms therein both connected across said terminals and said second bridge half having first and second bridge arms therein both connected across said terminals;

each of said bridge arms consisting of a plurality of series circuits connected in parallel and each series circuit comprising a free-running diode and a transistor switch connected in series;

the transistor switch and the free-running diode in each of the series circuits in the first bridge arm of the first bridge half being connected across said first terminals in a sequence opposite to a sequence in which the transistor switch and the free-running diode in each of said series circuits in the second bridge arm in the first bridge half are connected across said terminals;

the transistor switch and the free-running diode in each of the series circuits in said first bridge arm of said second bridge half being connected across said terminals in a sequence opposite to a sequence in which the transistor switch and the free-running diode in the series circuits in said second bridge arm of said second bridge half are connected across said terminals;

said transistor switches and said free-running diodes in each of said first and second bridge arms in each of said first and second bridge halves being linearly arranged; and a plurality of inductors, an inductor of said plurality being respectively connected between each series circuit of each of said first and second bridge arms of each of said first and second bridge halves and said load, each inductor of said plurality being connected so that it is current-compensated and has an effective inductance only if a non-uniform division of current occurs among the series circuits in a bridge arm to which that inductor is connected.

2. A power amplifier as claimed in claim 1 wherein said plurality of inductors includes a plurality of magnetically coupled inductor pairs, the inductors in each pair being respectively connected to a series circuit in the first bridge arm and a series circuit in the second bridge arm of each of said first and second bridge halves each inductor pair being formed by a first common core having two windings thereon, so that the two windings on the core produce opposite magnetic fluxes and no resultant magnetic flux arises when said first and second currents in said two windings are equal.

3. A power amplifier as claimed in claim 2 wherein each core comprises a ferrite core, and wherein each of said windings comprises a single conductor plugged through said ferrite core.

4. A power amplifier as claimed in claim 1 further comprising an elongated cooling member on which said transistor switches and free-running diodes are mounted for cooling, with the transistors switch and the free-running diode connected to each other in each series circuit being disposed in immediate proximity with each other on said elongated cooling member.

5. A power amplifier as claimed in claim 4 wherein said elongated cooling member comprises a water-cooled quadrangular tube.

6. A power amplifier as claimed in claim 4 wherein all transistor switches and all free-running diodes of one of said bridge arms are disposed on one elongated cooling member.

7. A power amplifier as claimed in claim 6 comprising two of said elongated cooling members disposed parallel to each other, with all transistor switches and free-running diodes in one bridge arm in one of said bridge halves being disposed on one of said cooling members and all transistor switches and free-running diodes in the other bridge arm of said one bridge half being disposed on the other of said cooling members.

8. A power amplifier as claimed in claim 7 wherein each of said inductors respectively connected to a series circuit in a bridge arm in a bridge half is magnetically coupled to another inductor respectively connected to a series circuit in the other bridge arm of said bridge half, and wherein the free-running diodes and transistors switches connected in series circuits which are respectively connected to inductors which are magnetically coupled are disposed on said cooling member in immediate spatial proximity.

9. A power amplifier as claimed in claim 8 further comprising two current bus bars connecting said inductors to said inductive load are disposed parallel to said elongated cooling member.

10. A power amplifier as claimed in claim 9 further comprising an electrical connection between said current bus bars and said transistors and free-running diodes comprising a plurality of conductors plugged through said ferrite core.

11. A power amplifier as claimed in claim 4 further comprising two current bus bars connecting said inductors to said inductive load are disposed parallel to said elongated cooling member.

12. A power amplifier as claimed in claim 4 further comprising at least one printed circuit board, carrying said transistor switches and free-running diodes disposed parallel to said elongated cooling member.

13. A power amplifier as claimed in claim 12 wherein said printed circuit boards carry terminals for said supply voltage sources connected to said supply voltage sources.

14. A power amplifier as claimed in claim 1 further comprising:

first source of drive signals connected via a first plurality of signal lines to the respective transistor switches in said first bridge half for supplying drive signals to said transistor switches in said first bridge half, said signal lines in said first plurality having respectively different lengths so that said drive signals on the respective signal lines in said first plurality have respectively different transit times from said first drive signal source to the respective transistor switches in said first bridge half;

a second drive signal source connected via a second plurality of signal lines to the respective transistor switches in said second bridge half for supplying drive signals to said transistor switches in said second bridge half, said signal lines in said second plurality having respectively different lengths so that said drive signals have respectively different transit times between said second signal source and said transistor switches in said second bridge half; and for each transistor switch in each bridge half, an RC element connected in the signal line for that transistor switch, said RC element having a time constant which is significantly greater than any differences in transit time of said drive signals in the bridge half in which the transistor switch is disposed.

* * * * *